United States Patent
Vaz et al.

(10) Patent No.: US 10,298,248 B1
(45) Date of Patent: May 21, 2019

(54) DIFFERENTIAL OFFSET CALIBRATION OF CHOPPING SWITCHES IN TIME-INTERLEAVED ANALOG-TO-DIGITAL CONVERTERS

(71) Applicant: Xilinx, Inc., San Jose, CA (US)

(72) Inventors: Bruno Miguel Vaz, Sao Domingos de Rana (PT); Christophe Erdmann, Ballsbridge (IE); Bob W. Verbruggen, Saggart (IE); John E. McGrath, Cahir (IE); Ali Boumaalif, Cork (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/912,318

(22) Filed: Mar. 5, 2018

(51) Int. Cl.
*H03M 1/10* (2006.01)
*H03M 1/12* (2006.01)
*H03K 19/177* (2006.01)

(52) U.S. Cl.
CPC ....... *H03M 1/1023* (2013.01); *H03M 1/1033* (2013.01); *H03M 1/12* (2013.01); *H03K 19/17708* (2013.01); *H03M 2201/639* (2013.01)

(58) Field of Classification Search
CPC .... H03M 1/1023; H03M 1/12; H03M 1/1033; H03M 2201/639; H03K 19/17708
USPC ........................................ 341/118, 120, 155
See application file for complete search history.

(56) References Cited

U.S. PATENT DOCUMENTS

| | | | |
|---|---|---|---|
| 7,301,486 B2 * | 11/2007 | Wang | H03M 1/1004 341/118 |
| 7,378,999 B1 | 5/2008 | McGrath et al. | |
| 9,503,115 B1 | 11/2016 | Shin et al. | |
| 9,584,145 B1 | 2/2017 | Shin et al. | |
| 9,859,907 B1 * | 1/2018 | Li | H03M 1/0617 |

OTHER PUBLICATIONS

Jamal, Shafiq M. et al., "A 10-b 120-Msample/s Time-Interleaved Analog-to-Digijal Converter With Digital Background calibration," Journal of Solid-State Circuits, Dec. 2002, pp. 1618-1627, vol. 37, No. 12, IEEE, Piscataway, New Jersey. USA.
Janssen, Erwin et al., "An 11b 3.6GS/s time-interleaved SAR ADC in 65nm CMOS," Solid-State Circuits Conference Digest of Technical Papers (ISSCC), Feb. 17, 2013, pp. 464-465, IEEE, Piscataway, New Jersey. USA.
Specification and drawings for U.S. Appl. No. 15/914,364, filed Mar. 7, 2018, Verbruggen et al.

* cited by examiner

*Primary Examiner* — Khai M Nguyen
(74) *Attorney, Agent, or Firm* — Robert M. Brush

(57) ABSTRACT

An example apparatus for analog-to-digital conversion includes a plurality of channels each including an analog-to-digital converter (ADC), a switch configured to couple a differential input to the ADC, a first offset calibration circuit coupled to an output of the ADC, a multiplier coupled to an output of the first offset calibration circuit, a second offset calibration circuit coupled to an output of the multiplier, and a pseudorandom bit sequence (PRBS) generator coupled to the switch and the multiplier. The apparatus further includes a gain calibration circuit coupled to an output of the second offset calibration circuit in each of the plurality of channels; and a time-skew calibration circuit coupled to an output of the gain calibration circuit.

20 Claims, 5 Drawing Sheets

DIFFERENTIAL OFFSET CALIBRATION OF CHOPPING SWITCHES IN TIME-INTERLEAVED ANALOG-TO-DIGITAL CONVERTERS

This invention was made, in part, with Government support under Agreement No. HR0011-16-3-0004, awarded by Defense Advanced Research Projects Agency. The Government has certain rights in the invention.

TECHNICAL FIELD

Examples of the present disclosure generally relate to electronic circuits and, in particular, to differential offset calibration of chopping switches in time-interleaved analog-to-digital converters (ADCs).

BACKGROUND

Time-interleaved analog-to-digital converters (ADCs) can include a digital background calibration of interleaved offset, gain, and time-skew. There are many different implementations of each type of calibration. Some techniques utilize foreground calibration, while other techniques utilize background calibration. Some techniques calibration in the digital domain, while other techniques calibration in the analog domain.

In particular, a time-interleaved ADC can include an offset calibration block (OCB) configured to measure the average of the ADC output signal and remove offset. There is a limitation for signals at multiples of the channel sampling frequency. When the ADC samples a signal with an input frequency at multiples of its sampling frequency, the signal is aliased to DC and hence ends up being removed by the OCB (i.e., the OCBs remove the sampled signal completely). It is desirable to provide a technique for offset calibration that avoids this limitation.

SUMMARY

Techniques for differential offset calibration of chopping switches in time-interleaved analog-to-digital converters (ADCs) are described. In an example, an apparatus for analog-to-digital conversion includes: a plurality of channels each including: an analog-to-digital converter (ADC); a switch configured to couple a differential input to the ADC; a first offset calibration circuit coupled to an output of the ADC; a multiplier coupled to an output of the first offset calibration circuit; a second offset calibration circuit coupled to an output of the multiplier; and a pseudorandom bit sequence (PRBS) generator coupled to the switch and the multiplier. The apparatus further includes a gain calibration circuit coupled to an output of the second offset calibration circuit in each of the plurality of channels; and a time-skew calibration circuit coupled to an output of the gain calibration circuit.

In an example, an integrated circuit (IC) includes: an analog circuit configured to generate a differential signal; and analog-to-digital conversion circuitry. The analog-to-digital conversion circuit includes: a plurality of channels each including: an analog-to-digital converter (ADC); a switch configured to couple a differential input to the ADC; a first offset calibration circuit coupled to an output of the ADC; a multiplier coupled to an output of the first offset calibration circuit; a second offset calibration circuit coupled to an output of the multiplier; and a pseudorandom bit sequence (PRBS) generator coupled to the switch and the multiplier. The analog-to-digital conversion circuitry further includes a gain calibration circuit coupled to an output of the second offset calibration circuit in each of the plurality of channels; and a time-skew calibration circuit coupled to an output of the gain calibration circuit.

In an example, a method of calibrating analog-to-digital conversion circuitry includes: disabling, at a first time, a differential input to a switch configured to couple the differential input to an analog-to-digital converter (ADC); operating a first offset calibration circuit coupled to an output of the ADC, a multiplier coupled to an output of the first calibration circuit, and a second offset calibration circuit coupled to an output of the multiplier; disabling an accumulator in the second offset calibration circuit at a second time after the first time; and enabling the differential input after the second time.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
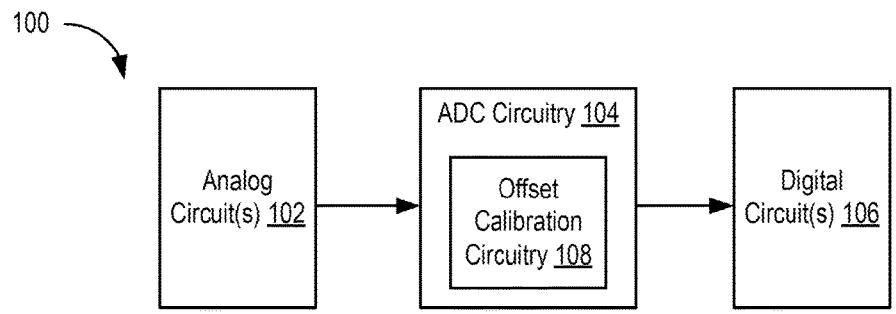
FIG. 1 is a block diagram depicting an analog-to-digital system 100 according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for differential offset calibration of chopping switches in time-interleaved analog-to-digital converters (ADCs) are described. In an example, an apparatus for analog-to-digital conversion enables removal of the time-interleaved offset spurs in a time-interleaved ADC, including the effect of flicker noise and offset of chopping switches. The techniques also enable the acquisition of input signals at multiples of the sampling frequency of the internal channel ADCs without affecting the behavior of the offset calibration blocks and without signal corruptions. The techniques further enable using the entire full-rate Nyquist spectrum by removing conventional constraints on the input signal associated with time-interleaved ADCs. These and further aspects are discussed below with respect to the drawings.

FIG. 1 is a block diagram depicting an analog-to-digital system 100 according to an example. The system 100 includes one or more analog circuits 102, analog-to-digital converter (ADC) circuitry 104, and one or more digital circuits 106. The analog circuit(s) 102 generate one or more analog signals as output (e.g., continuous time, continuous amplitude signals). The ADC circuitry 104 processes the analog signal(s) and generates one or more digital signals as output (e.g., discrete time, discrete amplitude signals). The digital circuit(s) 106 receive the digital signal(s) for further processing. For example, the analog circuit(s) 102 can be sensors disposed on an integrated circuit (IC), such as temperature sensors, voltage sensors, current sensors, or the like. The ADC circuitry 104 and digital circuit(s) 106 can be part of a monitor circuit or the like configured to monitor the analog signals output by the sensors and perform various actions. It should be understood that there are a myriad of other applications for the ADC circuitry 104. In an example, the ADC circuitry 104 comprises a time-interleaved ADC that includes offset calibration circuitry 108. The offset calibration circuitry 108 is configured to perform digital background calibration of interleaved offset, as describe further below.

Figure 2:
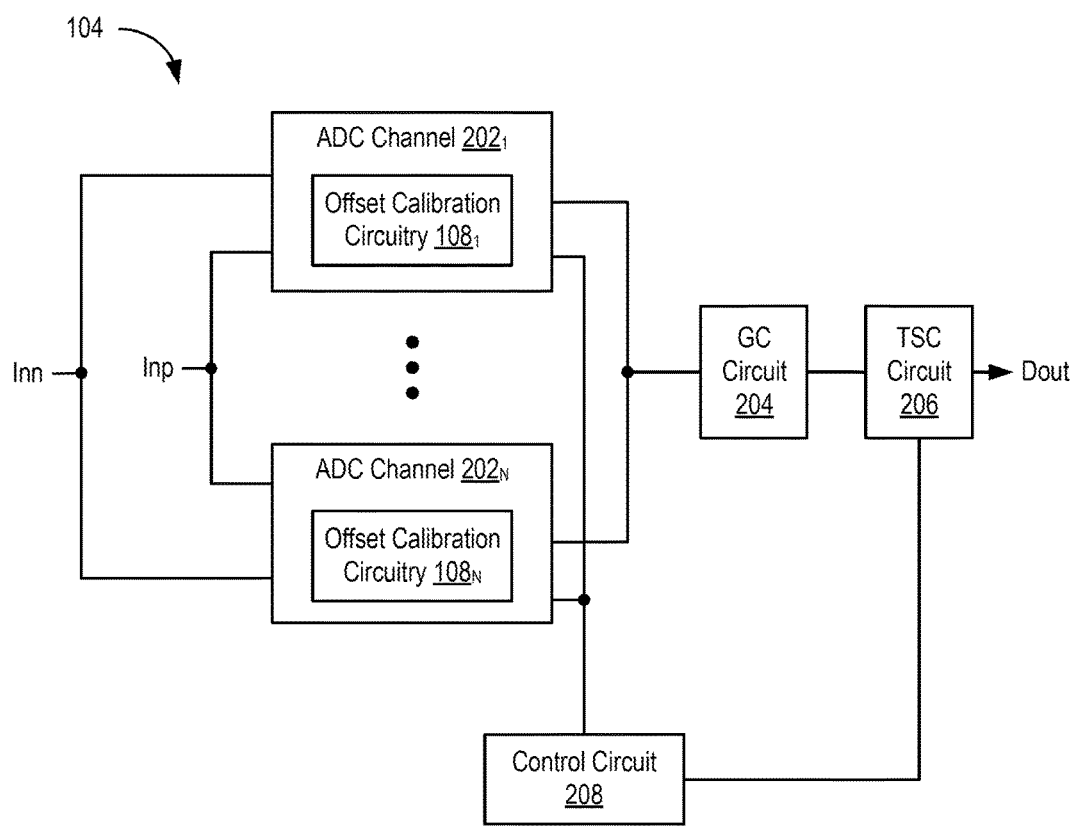
FIG. 2 is a block diagram depicting ADC circuitry according to an example.

FIG. 2 is a block diagram depicting the ADC circuitry 104 according to an example. In the example, the ADC circuitry 104 receives a differential analog signal as input. The differential analog signal includes a positive component Inp and a negative component Inn. The ADC circuitry 104 includes a plurality of ADC channels, e.g., ADC channels $202_1 \ldots 202_N$, where N is an integer greater than one. The ADC circuitry 104 further includes a gain calibration (GC) circuit 204 and a time-skew calibration (TSC) circuit 206. Inputs of each ADC channel $202_1 \ldots 202_N$ receive the positive and negative components of the differential analog input signal. Digital outputs of the ADC channels $202_1 \ldots 202_N$ are coupled to an input of the GC circuit 204. An output of the GC circuit 204 is coupled to an input of the TSC circuit 206. An output of the TSC circuit 206 provides a digital output signal of the ADC circuitry 104. The ADC channels $202_1 \ldots 202_N$ include instances $108_1 \ldots 108_N$ of offset calibration circuitry (described further below). The ADC circuitry 104 further includes a control circuit 208. An output of the control circuit 208 is coupled to control inputs of each of the ADC channels $202_1 \ldots 202_N$.

In operation, the ADC channels $202_1 \ldots 202_N$ each sample the differential analog input signal. The ADC channels $202_1 \ldots 202_N$ receive clock signals from the control circuit 208 and sample the differential analog signal in time-interleaved fashion. For example, each ADC channel 202 can sample the differential analog signal at a different phase of a given clock signal. For each ADC channel 202, the offset calibration circuitry 108 measures and removes the average of the output of the ADC channel 202. The offset calibration circuitry 108 operates as described further below. The GC circuit 204 is configured to compare the root mean squared (RMS) power of each ADC channel 202 and adjust the outputs with respect to a reference. The TSC circuit 206 is configured to measure the delta between consecutive samples output by the GC circuit 204 and adjust delay of the clock signals output by the control circuit.

Figure 3:
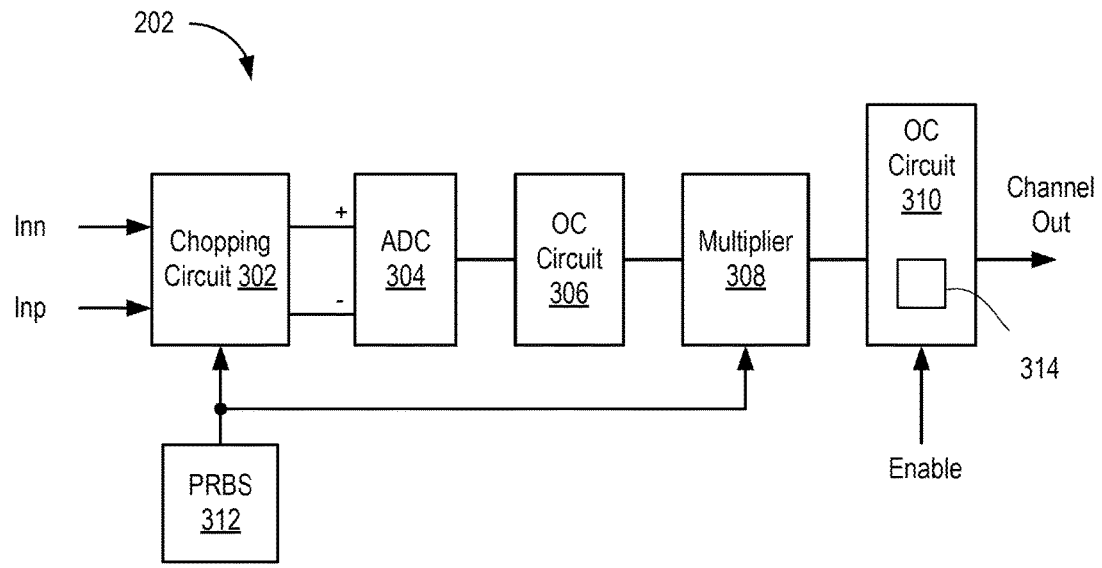
FIG. 3 is a block diagram depicting an ADC channel according to an example.

FIG. 3 is a block diagram depicting an ADC channel 202 according to an example. The ADC channel 202 includes a chopping circuit 302 (e.g., a switch), an ADC 304, an OC circuit 306, a multiplier 308, an OC circuit 310, and a pseudorandom binary sequence (PRBS) circuit 312. Inputs of the chopping circuit 302 receive the differential analog signal as input. A differential output of the chopping circuit 302 is coupled to a differential input of the ADC 304. An output of the ADC 304 is coupled to an input of the OC circuit 306. An output of the OC circuit 306 is coupled to an input of the multiplier 308. An output of the multiplier 308 is coupled to an input of the OC circuit 310. An output of the OC circuit 310 provides the output of the ADC channel 202. An output of the PRBS circuit 312 is coupled to an input of the chopping circuit 302 and an input of the multiplier 308.

In operation, the chopping circuit 302 samples the differential analog input signal. The chopping circuit 302 alternates coupling Inn and Inp to the non-inverting (+) and inverting (−) terminals of the ADC 304 based on a signal output by the PRBS circuit 312. In this manner, the digital signal output by the ADC 304 is randomized. Also, the chopping circuit 302 prevents the analog input signal at the sampling frequency of the ADC channel 202 from being seen as DC. The OC circuit 306 removes the offset of the ADC 304. The multiplier 308 "un-chops" the output of the OC circuit 306 using the same PRBS signal output from the PRBS circuit 312. In addition to enabling the presence of signals at the sampling frequency, this configuration also has the capability of reducing the effect of flicker noise. If the frequency response of the OC circuit 306 is low enough, the OC circuit 306 is unable to follow the flicker noise, which ends up getting scrambled across the spectrum instead of appearing at multiples of the channel sampling frequency.

However, this technique by itself is not able to detect the differential offset between chopping sampling. This offset component passes through the OC circuit 306 and the multiplier 308 and would end up as time-interleaved residual spurs in the spectrum. The amplitude of such residual spurs depends on the technology and can be as large as −80 dBFS (decibels relative to full scale) for deep submicron technologies, which is not tolerable for various applications. Accordingly, in the example shown in FIG. 3, the additional OC circuit 310 is provided. The OC circuit 310 removes the residual differential offset introduced from the chopping circuit 302. The additional OC circuit 310 processes the un-chopped input signal and is sensitive to input frequencies having a multiple of the sampling frequency. Thus, in an example, the OC circuit 310 should only be continuously in operation (enabled) for cases where multiples of the sampling frequency are absent.

Figure 4:
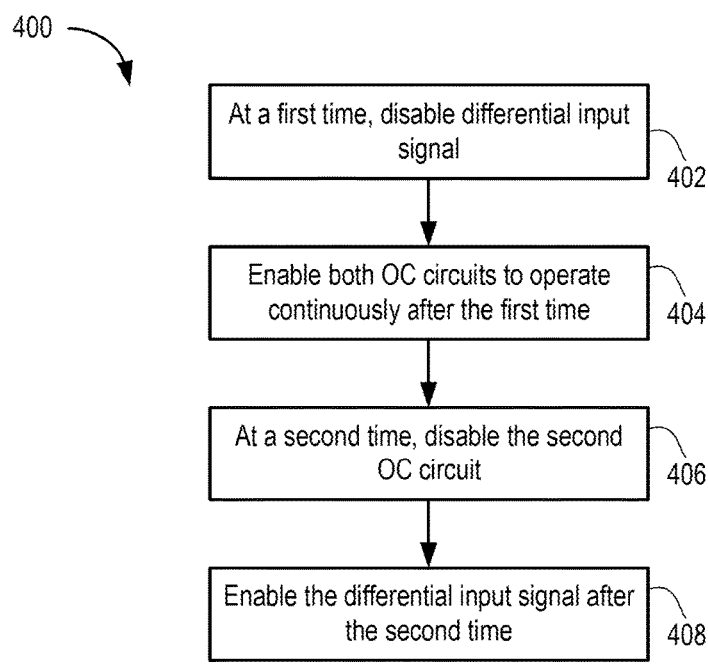
FIG. 4 is a flow diagram depicting a method of operating an ADC channel according to an example.

FIG. 4 is a flow diagram depicting a method 400 of operating the ADC channel 202 according to an example. The method 400 can be performed as a foreground calibration cycle to allow for the presence of any input frequency, including multiples of the sampling frequency. The method 400 begins at step 402, where, at a first time, the control circuit 208 disables the differential input signal. When disabled, the differential input signal has zero amplitude. At step 404, the control circuit 208 enables both the OC circuit 306 and the OC circuit 310 to operate continuously after the first time. In an example, the OC circuit 306 always operates continuously. In another example, the OC circuit 306 can include an enable input similar to that shown for the OC circuit 310. At step 406, at a second time, the control circuit 208 disables the OC circuit 310. For example, the control circuit 208 can disable or "freeze" an accumulator 314 of the OC circuit 310 to stop the offset measurement function thereof and keep only the correction function operational. At step 408, the control circuit 208 enables the differential signal after the second time. The method 400 guarantees that all sources of offset are eliminated and is robust to supply voltage and temperature variations. A single execution of the method 400 at start-up can be sufficient to cover a full range of supply and temperature.

Figure 5:
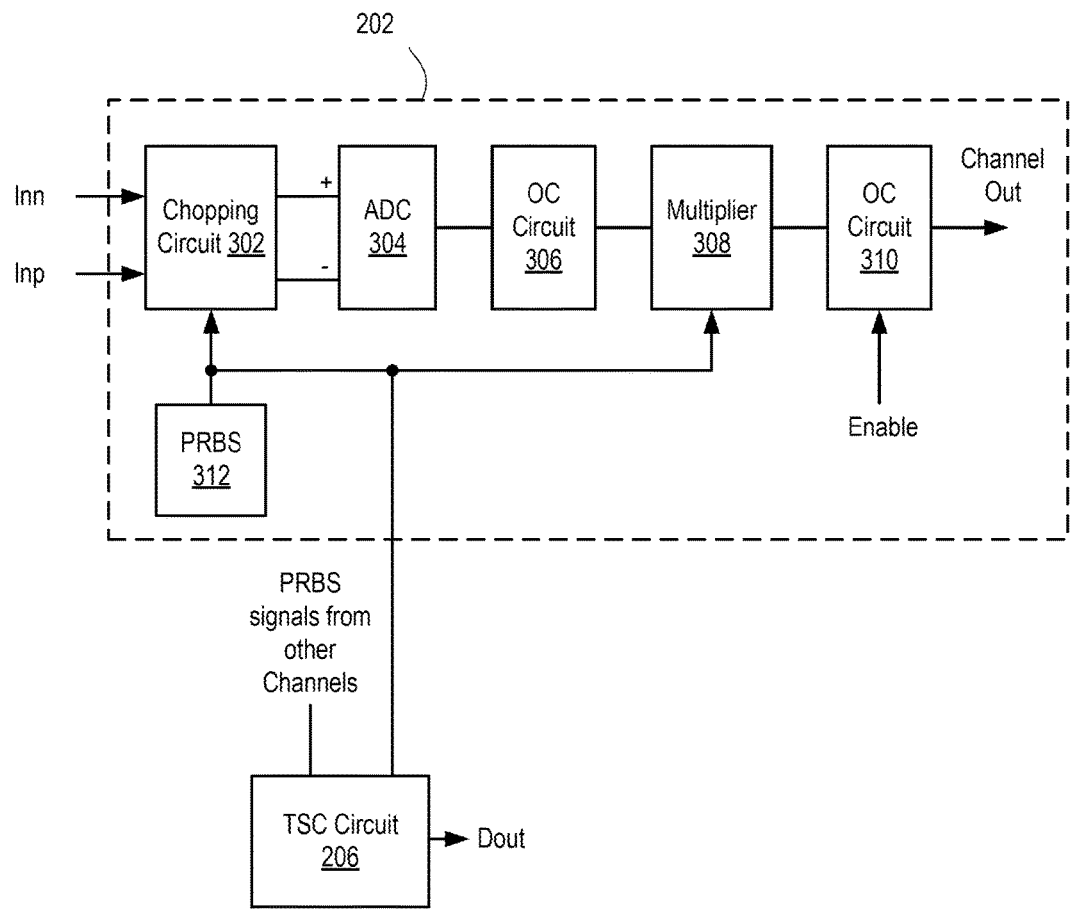
FIG. 5 is a block diagram depicting an ADC channel 202 according to another example.

The addition of the chopping circuit 302 has consequences to the TSC circuit 206 as well. This is because different chopping switches will have different time-skews and the TSC circuit 206 should have the capability to differentiate the timing information from all switches. This can be achieved by sending the PRBS signal from the PRBS circuit 312 to the TSC circuit 206. FIG. 5 is a block diagram depicting an ADC channel 202 according to another example. Elements of FIG. 5 that are the same or similar to those of FIG. 3 are described in detail above. In the example of FIG. 5, the output of the PRBS circuit 312 is also coupled to the TSC circuit 206. As such, the TSC circuit 206 is coupled to the PRBS circuit 312 in each of the ADC channels 202.

Figure 6:
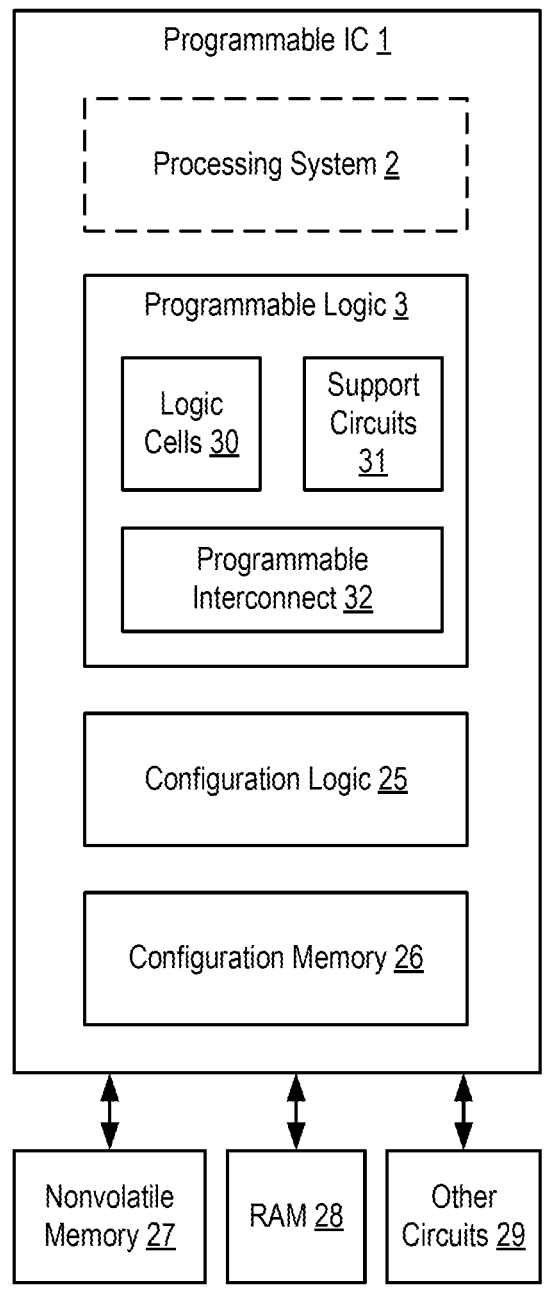
FIG. 6 is a block diagram depicting a programmable integrated circuit (IC) in which techniques described herein can be employed.

FIG. 6 is a block diagram depicting a programmable IC 1 according to an example in which the ADC circuitry 104 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 7:
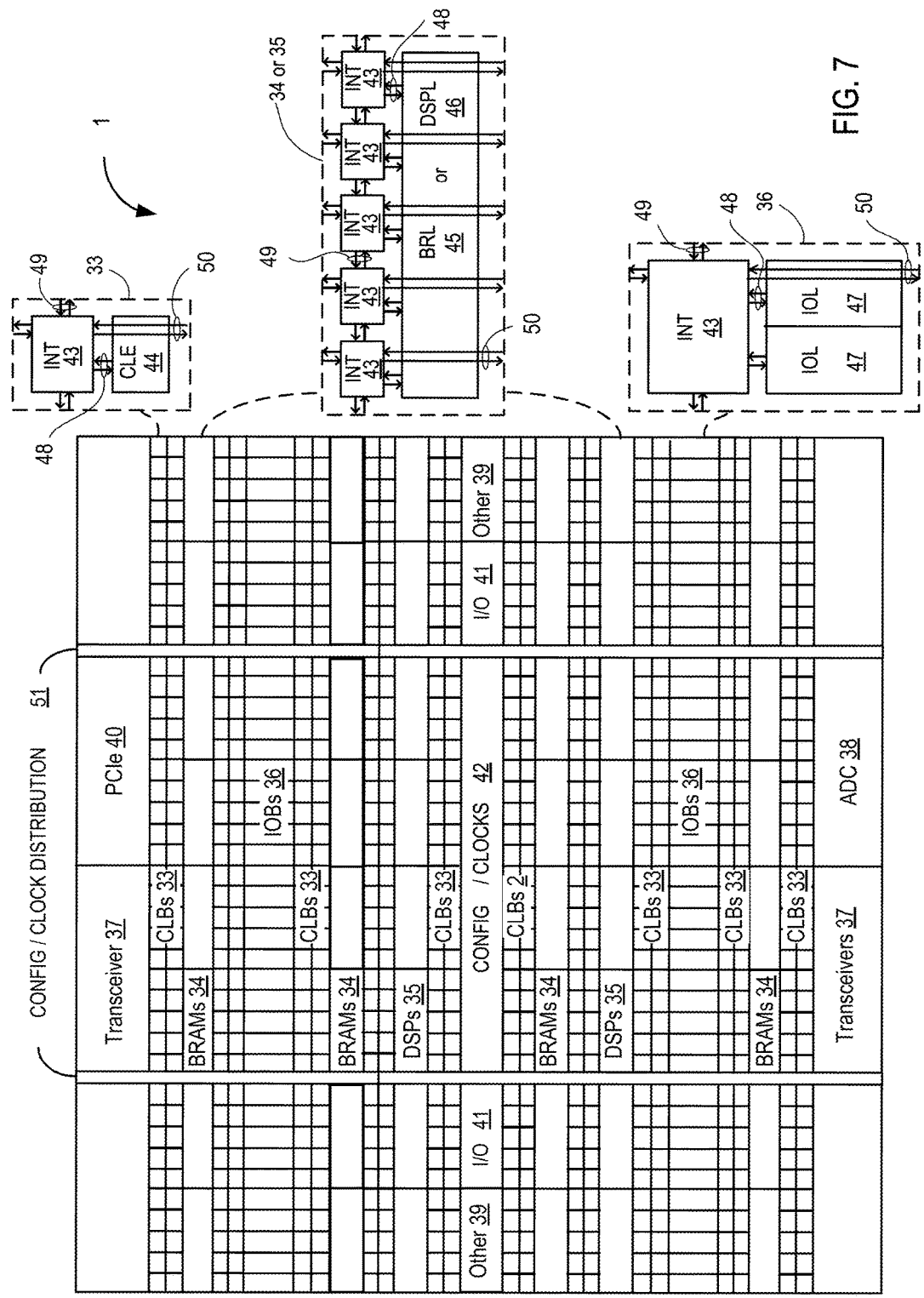
FIG. 7 is a schematic diagram of a field programmable gate array (FPGA) architecture in which techniques described herein can be employed.

FIG. 7 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like, including the ADC circuitry 104.

In some FPGAs, each programmable tile can include at least one programmable interconnect element ("INT") 43 having connections to input and output terminals 48 of a programmable logic element within the same tile, as shown by examples included at the top of FIG. 7. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 7) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. An apparatus for analog-to-digital conversion, comprising:
 a plurality of channels each including:
  an analog-to-digital converter (ADC);
  a switch configured to couple a differential input to the ADC;
  a first offset calibration circuit coupled to an output of the ADC;
  a multiplier coupled to an output of the first offset calibration circuit;
  a second offset calibration circuit coupled to an output of the multiplier; and
  a pseudorandom bit sequence (PRBS) generator coupled to the switch and the multiplier;
 a gain calibration circuit coupled to an output of the second offset calibration circuit in each of the plurality of channels; and
 a time-skew calibration circuit coupled to an output of the gain calibration circuit.

2. The apparatus of claim 1, wherein the second offset calibration circuit includes a control input configured to freeze an accumulator therein.

3. The apparatus of claim 2, further comprising:
 a control circuit configured to disable the differential input at a first time, freeze the accumulator in the second offset calibration circuit at a second time after the first time, and enable the differential input after the second time.

4. The apparatus of claim 1, wherein the time-skew calibration circuit is coupled to the PRBS generator in each of the plurality of channels.

5. The apparatus of claim 1, wherein the switch is a chopping circuit.

6. The apparatus of claim 5, wherein the chopping circuit is configured to alternate coupling positive and negative components of the differential input to inverting and non-inverting terminals of the ADC.

7. The apparatus of claim 6, wherein the chopping circuit is configured to alternate coupling the positive and the negative components of the differential input to the inverting and the non-inverting terminals of the ADC based on a signal output from the PRBS generator.

8. A integrated circuit (IC), comprising:
 an analog circuit configured to generate a differential signal;
 analog-to-digital conversion circuitry including:
 a plurality of channels each including:
  an analog-to-digital converter (ADC);
  a switch configured to couple a differential input to the ADC;
  a first offset calibration circuit coupled to an output of the ADC;
  a multiplier coupled to an output of the first offset calibration circuit;
  a second offset calibration circuit coupled to an output of the multiplier; and
  a pseudorandom bit sequence (PRBS) generator coupled to the switch and the multiplier;
 a gain calibration circuit coupled to an output of the second offset calibration circuit in each of the plurality of channels; and
 a time-skew calibration circuit coupled to an output of the gain calibration circuit.

9. The IC of claim 8, further comprising:
 a digital circuit configured to receive a digital signal from the analog-to-digital conversion circuitry.

10. The IC of claim 8, wherein the second offset calibration circuit includes a control input configured to freeze an accumulator therein.

11. The IC of claim 10, further comprising:
 a control circuit configured to disable the differential input at a first time, freeze the accumulator in the second offset calibration circuit at a second time after the first time, and enable the differential input after the second time.

12. The IC of claim 8, wherein the time-skew calibration circuit is coupled to the PRBS generator in each of the plurality of channels.

13. The IC of claim 8, wherein the switch is a chopping circuit.

14. The IC of claim 13, wherein the chopping circuit is configured to alternate coupling positive and negative components of the differential input to inverting and non-inverting terminals of the ADC.

15. The IC of claim 14, wherein the chopping circuit is configured to alternate coupling the positive and the negative components of the differential input to the inverting and the non-inverting terminals of the ADC based on a signal output from the PRBS generator.

16. A method of calibrating analog-to-digital conversion circuitry, comprising:
 disabling, at a first time, a differential input to a switch configured to couple the differential input to an analog-to-digital converter (ADC);
 operating a first offset calibration circuit coupled to an output of the ADC, a multiplier coupled to an output of the first calibration circuit, and a second offset calibration circuit coupled to an output of the multiplier;
 disabling an accumulator in the second offset calibration circuit at a second time after the first time; and
 enabling the differential input after the second time.

17. The method of claim 16, further comprising:
 providing a pseudorandom bit sequence to the switch and the multiplier.

18. The method of claim 17, further comprising:
 providing an output of the second offset calibration circuit to a gain calibration circuit;
 providing an output of the gain calibration circuit to a time-skew calibration circuit; and
 providing the pseudorandom bit sequence to the time-skew calibration circuit.

19. The method of claim 16, wherein the switch is a chopping circuit.

20. The method claim 19, wherein the chopping circuit is configured to alternate coupling positive and negative components of the differential input to inverting and non-inverting terminals of the ADC.

* * * * *